Sept. 16, 1952 B. F. SPENCER 2,611,081

AUTOMATIC GAIN CONTROL SYSTEM

Filed Nov. 22, 1948 3 Sheets-Sheet 1

INVENTOR
BENJAMIN F. SPENCER
BY
Paul B. Hunter
ATTORNEY

Sept. 16, 1952 B. F. SPENCER 2,611,081

AUTOMATIC GAIN CONTROL SYSTEM

Filed Nov. 22, 1948 3 Sheets-Sheet 2

INVENTOR
BENJAMIN F. SPENCER
BY Paul B. Hunter
ATTORNEY

Sept. 16, 1952 B. F. SPENCER 2,611,081

AUTOMATIC GAIN CONTROL SYSTEM

Filed Nov. 22, 1948 3 Sheets-Sheet 3

INVENTOR
BENJAMIN F. SPENCER
BY
Paul B. Hunter
ATTORNEY

Patented Sept. 16, 1952 2,611,081

UNITED STATES PATENT OFFICE 2,611,081

AUTOMATIC GAIN CONTROL SYSTEM

Benjamin F. Spencer, Garden City, N. Y., assignor to The Sperry Corporation, a corporation of Delaware Application November 22, 1948, Serial No. 61,361

4 Claims. (Cl. 250—20)

This invention relates to automatic gain control systems and in particular to amplified automatic gain control systems.

Amplified automatic gain control (AGC) systems or automatic volume control (AVC) systems are well known in the art. In general, the amplification of the AGC voltage is obtained directly by a direct-coupled amplifier coupled so as to amplify the unidirectional output voltage from the AGC rectifying device or the amplification is obtained indirectly by providing radio-frequency or audio-frequency amplification preceding the AGC rectifying device.

While these prior systems have been satisfactory in many specific applications, they possess certain limitations and disadvantages. For example, a direct-coupled amplifier coupled to the output circuit of the AGC rectifying device requires a stable source of negative supply voltage to set the potentials of the direct-coupled amplifier in order to provide a control voltage that is negative with respect to ground. Sources of negative supply voltage are often expensive to provide and difficult to justify especially when, as is usually the case, the direct-coupled amplifier is the only stage requiring a source of negative voltage. Furthermore, it is difficult to design a direct-coupled amplifier that is unaffected by power supply voltage variations and tube changes.

Amplified AGC systems, employed in radio receiving systems, in which the amplification is obtained indirectly by an audio-frequency or signal intelligence amplifier following the second detector but preceding the AGC rectifying device are adversely affected by variations of the percentage of modulation of the received carrier wave. Variations of the percentage of modulation result in corresponding variations of the AGC voltage. This type of AGC system is thus practically limited to radio systems employing a constant percentage of modulation, and is not widely used.

One of the most satisfactory amplified AGC systems of the prior art is the type employing an additional stage of radio-frequency or intermediate-frequency amplification preceding the AGC rectifying device in which the amplification in the additional stage is obtained at the same frequency as the amplifiers that are controlled. This type of amplified AGC system has been generally applied to high quality communication and navigation type receiving equipments. However, in certain ultra-high frequency (UHF) or super-high frequency (SHF) receivers of the communication and navigation types, this amplified AGC system has not been all together satisfactory. For instance, in UHF navigational receivers of the instrument landing type in which no suitable method is known for obtaining amplification directly at the frequency of the UHF signal wave to be received, the amplification of the signal wave is by necessity obtained, after heterodyning in a converter stage, by a cascade series of intermediate-frequency amplifier stages. In such a receiver there exists an upper limit to the total amount of stable amplification obtainable in the I. F. amplifier system. In practice in such a receiver, this upper limit is unavoidably reached as the I. F. amplifier system must operate with input signal voltages as small as a fraction of a microvolt and must produce an output signal voltage of several volts to the second detector. An additional stage of amplification preceding the AGC rectifier and operating at the same frequency as that of the I. F. amplifier system provides a total over-all amplification greatly in excess of this upper limit and there results a condition of highly undesirable regenerative feedback producing intolerable instability in the over-all I. F. amplification system.

To further complicate the gain control problem, a receiver of the instrument landing type must operate over a range of radiated signal intensity varying from a few micromicrowatts at great distances from the instrument landing transmitting antenna to a very great radiated signal intensity at the landing point, produced by a high gain electromagnetic parabolic horn concentrating and focusing energy directly in this landing region. Such a receiver to be at all usable must possess a smoothly acting, high-gain amplified AGC system to prevent over-loading of the I. F. amplifier stages and in addition to prevent the amplifier providing the AGC amplification from becoming overloaded.

An important object of the invention is to improve the stability of amplifiers in which amplified automatic gain control is required.

Another object is to provide an amplified automatic gain control system which is not susceptible to overloading.

An additional object is to provide an amplified automatic gain control system with increased amplification of the AGC voltage.

A further object is to provide an amplified automatic gain control system capable of highly stable performance over a very wide range of input signal levels.

In accordance with this invention, there is introduced an improved amplified automatic gain control system in which the amplification of the AGC voltage is effected through the use of an amplifier preceding the AGC rectifying device, this amplifier operating at a multiple of the frequency of the amplifier stages to be controlled.

The above objects and general description of the present invention will be more fully understood and further objects and advantages will become apparent from a study of the following detailed description, in connection with the drawings, wherein.

Figure 1:
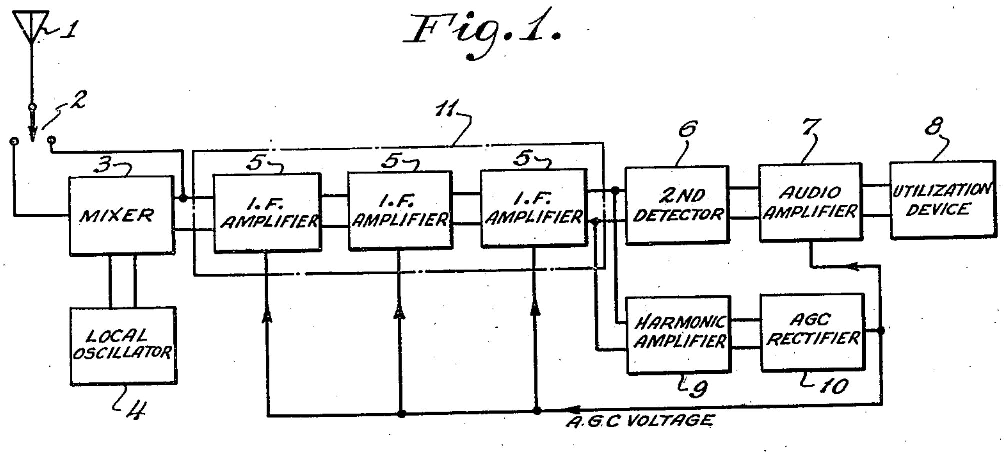
Figure 1 is a block diagram of a radio receiver employing the invention.

The receiver block diagram of Figure 1, which may be for example the block diagram of a navigational receiving system, shows an antenna 1 coupled to a single-pole double-throw switch 2. One terminal of switch 2 is coupled to mixer 3 and the other terminal is coupled to the first I. F. amplifier 5. Local oscillator 4 is coupled to mixer 3. Three stages of identical I. F. amplifiers 5 are coupled in cascade forming block 11, the last I. F. amplifier stage being coupled to second detector 6. Audio amplifier 7 is coupled to second detector 6 and utilization device 8 is coupled to audio amplifier 7. This utilization device may be, for example, a crosspointer meter as employed in instrument landing receivers or a position plotting mechanism as employed in range and azimuth radio navigation systems. Harmonic amplifier 9 couples the output of the last I. F. amplifier stage of block 11 to AGC rectifier 10.

The amplified AGC voltage from rectifier 10 is applied to each I. F. amplifier stage of block 11 and in addition to audio amplifier 7. The band-pass harmonic amplifier 9 provides amplification of the output voltage from the I. F. amplifiers 11, this amplification being obtained at a selected harmonic frequency of the I. F. amplifiers 11. With switch 2 positioned so that antenna 1 couples to mixer 3, the system of Fig. 1 operates as a superheterodyne receiver. If the switch is thrown to transfer the antenna directly to the input of the I. F. amplifiers 11, the system then operates as a fixed tuned radio-frequency receiver.

Figure 2:
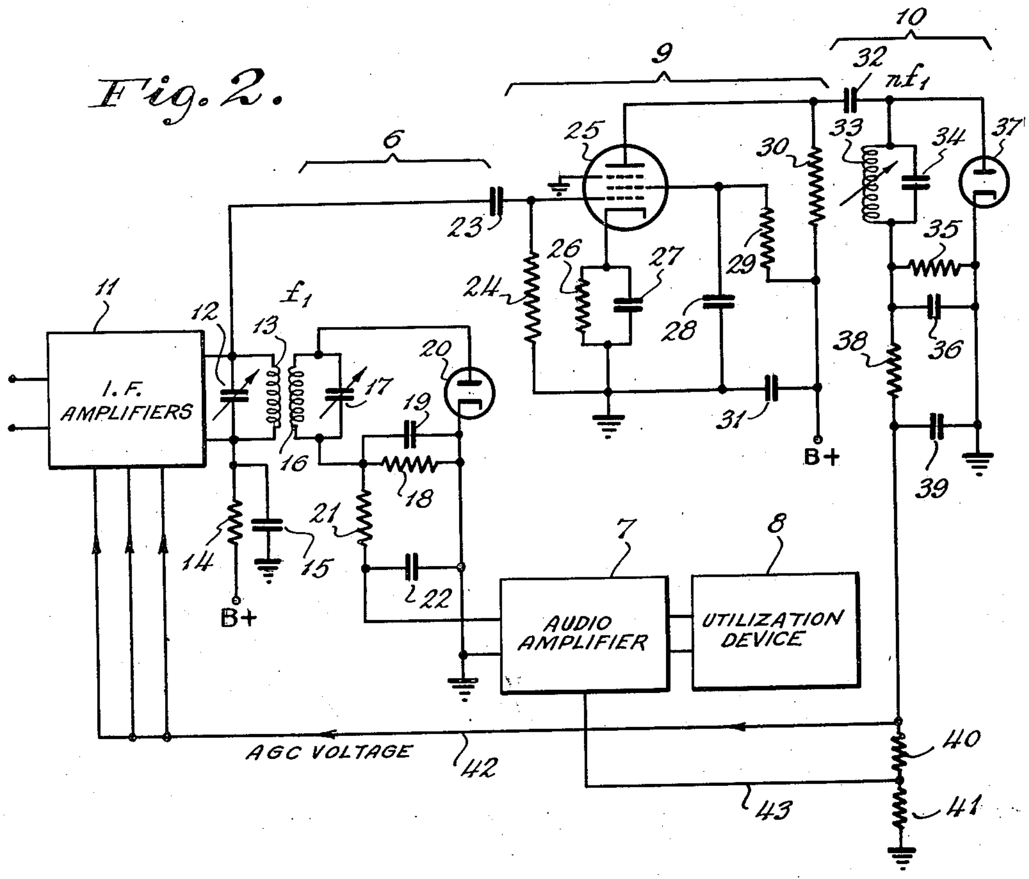
Figure 2 is a schematic diagram illustrating one embodiment of the invention.

The schematic diagram of Fig. 2 shows a parallel resonant circuit comprising condenser 12 and primary inductor 13 coupled to the last I. F. amplifier of block 11. The lower terminal junction of this resonant circuit is returned to the B+ terminal through resistor 14 and is bypassed to ground by condenser 15. A conventional second detector circuit comprising a diode detector tube 20 associated with a parallel resonant circuit of secondary inductor 16 and condenser 17 is transformer coupled to primary inductor 13. The signal intelligence voltage produced across diode load resistor 18 in parallel with filter condenser 19 is coupled through a second filter consisting of resistor 21 and condenser 22 to the audio amplifier 7.

The upper terminal junction of the parallel resonant circuit of condenser 12 and primary inductor 13 is capacity coupled to the control-electrode of a band-pass harmonic amplifier tube 25 through condenser 23. Resistor 24 returns the control-electrode to a common grounding terminal. Bias for the harmonic amplifier tube 25 is provided by cathode resistor 26 in parallel with bypass condenser 27. The screen-grid of tube 25 is bypassed to ground by condenser 28 and is coupled to the B+ terminal through resistor 29. The plate or anode of tube 25 is coupled to the B+ terminal through load resistor 30. Condenser 31 bypasses the B+ terminal to ground. The plate of tube 25 is capacity coupled to the plate of the AGC rectifier tube 37 by condenser 32. A parallel resonant circuit consisting of inductor 33 and condenser 34 is coupled from the plate of rectifier tube 37 to one terminal of rectifier load resistor 35. The other terminal of load resistor 35 is coupled to the cathode of tube 37 which is returned to ground.

A unidirectional AGC voltage produced across load resistor 35 is filtered by condenser 36 and is coupled through resistor 38 to a voltage divider comprising resistors 40 and 41. An additional filter condenser 39 is coupled in parallel with the voltage divider. The unidirectional AGC voltage across the divider is coupled over conductor lead 42 to the gain controlling electrodes of the I. F. amplifiers of block 11. A second AGC unidirectional voltage reduced in magnitude by the voltage divider is coupled from the junction of resistors 40 and 41 over conductor lead 43 to the gain controlling electrode of audio amplifier 7.

The conventional second detector associated with diode tube 20 operates in the usual manner. The transformer coupled resonant circuits consisting of condenser 12 and primary inductor 13 and secondary inductor 16 and condenser 17 are tuned to the center frequency of the pass band of the I. F. amplifiers 11. The band-pass harmonic amplifier associated with tube 25 is biased almost to cut-off by cathode resistor 26. Voltages of the pass-band frequency of the I. F. amplifiers coupled through condenser 23 to the control-electrode of tube 25 cause amplifier pulses of plate current to flow through resistor 30. These pulses of plate current couple through condenser 32 to excite the resonant circuit consisting of inductor 33 and condenser 34. This parallel resonant circuit is tuned to a selected harmonic frequency of the center pass band frequency of the I. F. amplifiers 11. The harmonic amplifier produces in its output circuit an amplified voltage at a frequency $nf_1$ with respect to the I. F. amplifier output voltage at frequency $f_1$, where $n$ is an integer greater than unity. This amplified output voltage at the frequency $nf_1$ is rectified by rectifier 37 and produces a unidirectional AGC voltage across load resistor 35. This AGC voltage is further filtered and applied over conductor lead 42 to the gain controlling electrodes of the I. F. amplifiers 11 and is also applied through a voltage divider to the gain controlling electrode of audio amplifier 7.

One important characteristic of this amplified AGC system is that the total amount of stable amplification at a single frequency $f_1$ may be obtained in the I. F. amplifiers 11 while the amplification of the AGC voltage is obtained by the harmonic amplifier 9 operating at a harmonic frequency $nf_1$ of the I. F. amplifiers. With this arrangement there is no regenerative feedback from the output of the harmonic amplifier to the input of the I. F. amplifiers to cause undesirable instability. The full limit of the total amount of stable amplification at a single frequency $f_1$, which is approximately 1,000,000, can thus be provided in the I. F. amplifier system. Any desired amount of amplification of the AGC voltage may now be provided by the harmonic amplifier 9 at a frequency $nf_1$ without impairing the stability of the I. F. amplifier system 11. A suitable harmonic amplifier operating as a frequency doubler can readily provide a voltage gain as high as 10.

Another important characteristic of this amplified AGC system is that for strong I. F. output voltages applied to the control-electrode of the harmonic amplifier tube 25, an additional bias voltage is developed across resistor 24 due to control-electrode current flow and the harmonic amplifier operates as a class C stage with a resulting increase in efficiency due to a more optimum angle of plate current flow. The distortion of the voltage wave at the control-electrode of tube 25 due to control-electrode current flow for strong voltage waves does not cause a limit to the amplification of tube 25 in the usual sense as the tube is operating as a frequency multiplier. While a conventional amplifier tube becomes saturated due to control-electrode current flow, as for example a limiter tube in a frequency modulation receiver, and its output voltage remains substantially constant upon further increase of the amplitude of the input voltage, the frequency multiplier stage does not become saturated due to a distorted control-electrode voltage. A distorted control-electrode voltage is rich in harmonic frequencies one of which is selected by the tuned output circuit of the frequency multiplier stage. As a matter of fact, this distortion together with the corresponding improvement in the angle of plate current flow produces an increased amplification in tube 25 for strong voltage waves. This is a very useful result for it tends to produce a greater AGC voltage just when a greater AGC voltage is required as contrasted to certain prior art systems in which the AGC system becomes overloaded at this level and the AGC system loses its control over the gain of the amplifiers.

An additional characteristic of this amplified AGC system is that a high gain may be obtained in the harmonic amplifier 9 if desired. In a conventional R. F. or I. F. amplifier stage, the "allowable" amount of stable amplification obtainable in a single amplifier tube is limited by the amount of undesired feedback through the plate to control-electrode capacity of the tube. To obtain high gain, conventional R. F. and I. F. amplifier stages employ pentode tubes with very small capacity between plate and control-electrode. However, for a harmonic amplifier stage in which the output circuit of the amplifier is tuned to a harmonic of the input frequency the "allowable" amount of stable amplification for a single amplifier tube is much higher than for a conventional R. F. or I. F. amplifier tube as no undesirable feedback exists from plate to control-electrode. This "allowable" gain is very high for the harmonic amplifier and as a result, triode type tubes with a very much larger plate to control-electrode capacity than pentodes can be readily employed.

Figures 3, 4:
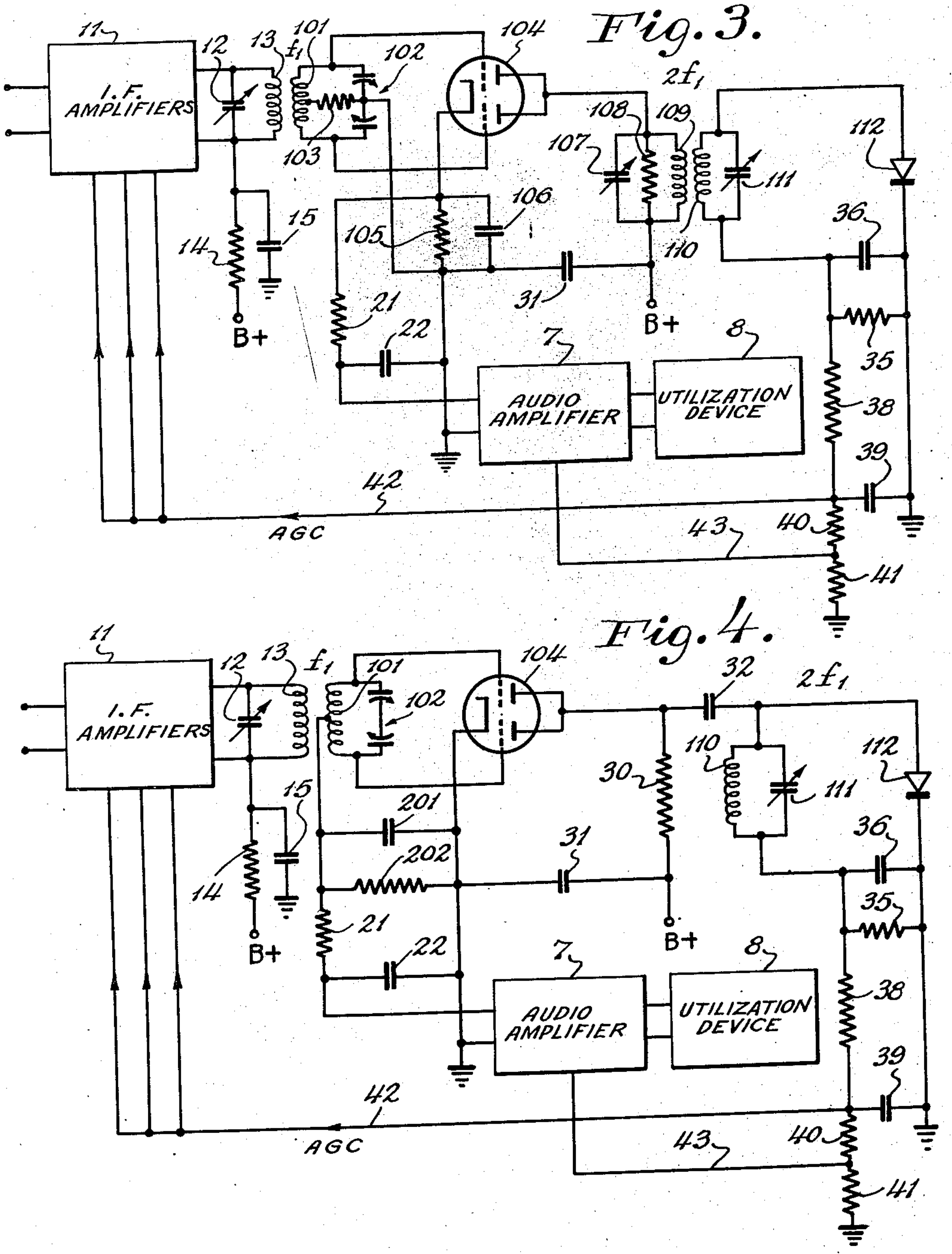
Figure 3 is a schematic diagram of a second embodiment of the invention employing a push-push frequency doubler amplifier.
Figure 4 is a schematic diagram illustrating an alternative arrangement of the circuit of Figure 3.

An illustration of a triode tube embodiment is shown in the schematic diagram of Fig. 3, in which a parallel resonant circuit comprising a secondary inductor 101 and a condenser 102 is transformer coupled to primary inductor 13. Resistor 103 couples the center tap of secondary inductor 101 to the rotor of the split-stator condenser 102. The rotor of this condenser is coupled to a common grounding terminal. The upper terminal junction of the resonant circuit is coupled to one control-electrode and the lower terminal junction is coupled to a second control-electrode of a dual triode tube 104. The cathode of tube 104 is coupled through a parallel combination of resistor 105 and condenser 106 to ground. The two plates of tube 104 are coupled together and to the upper terminal junction of a parallel resonant circuit of condenser 107, resistor 108 and primary inductor 109. The lower terminal junction of this resonant circuit is coupled to the B+ terminal and is also bypassed to ground by the condenser 31. Another parallel resonant circuit consisting of secondary inductor 110 and condenser 111 is transformer coupled to primary inductor 109. The upper terminal junction of this resonant circuit is coupled to one terminal of AGC rectifier 112, the other terminal of the rectifier being coupled to ground. The lower terminal junction of this resonant circuit is coupled to load resistor 35 in parallel with condenser 36, the other terminals of the load resistor and condenser being connected to ground. The transformer coupled resonant circuits are each tuned to twice the frequency of the I. F. amplifiers. The unidirectional AGC voltage developed across load resistor 35 is coupled through the filter comprising resistor 38 and condenser 39 to the voltage divider comprising resistors 40 and 41. The full AGC voltage across the divider is coupled over lead 42 to the gain controlling electrodes of the I. F. amplifiers 11 and the reduced AGC voltage at the junction of the divider resistors 40 and 41, is coupled over lead 43 to the audio amplifier 7.

The circuit arrangement of triode tube 104 serves a dual purpose. It is a combination full-wave infinite impedance detector and push-push frequency doubler amplifier, a combination well suited for this application. The control-electrodes of tube 104 are excited from the center-tapped resonant circuit of secondary inductor 101 and condenser 102 tuned to resonance at the intermediate frequency. Cathode resistor 105 is of such value as to bias the control-electrodes almost to cut-off. Condenser 106 in parallel with resistor 105 bypasses the cathode to ground at the intermediate frequency. The detected signal intelligence voltage developed across cathode resistor 105 is coupled through the filter of resistor 21 and condenser 22 to audio amplifier 7. The plates of tube 104 are essentially bypassed to ground at audio frequencies due to the small value of inductance of primary inductor 109 and the large value of capacity of condenser 31. The circuit thus functions as a full-wave infinite impedance detector. The circuit also functions as a push-push frequency doubler amplifier as the resonant circuit of condenser 107 and primary inductor 109 is tuned to twice the frequency of the I. F. amplifiers. Two pulses of plate current flow through this resonant circuit for each cycle of the I.F. output voltage. This type of frequency doubler amplifier is more efficient than the previous harmonic frequency multiplier amplifier and a somewhat higher voltage gain may be obtained. The AGC rectifier 112 coupled to this push-push frequency doubler amplifier supplies AGC voltage to the I.F. amplifiers and the audio amplifier as previously explained.

The circuit arrangement of Fig. 4 employs tube 104 as a combination full-wave grid-leak detector and push-push frequency doubler amplifier. The cathode of the tube 104 is grounded. The center tap of secondary inductor 101 is returned to ground through a large grid-leak resistor 202. Condenser 201 bypasses the center tap of secondary inductor 101 to ground at the intermediate frequency. The plates of tube 104 are coupled together and are returned through load resistor 30 to the B+ terminal. The plates of tube 104 are coupled also through condenser 32 to the resonant circuit of inductor 110 and condenser 111. This resonant circuit is tuned to twice the intermediate frequency. The AGC rectifier 112 is coupled to this resonant circuit in the conventional manner.

In the full-wave grid-leak detector, rectification takes place in the grid circuit with the grids and cathode functioning as a full-wave diode detector and with the rectified voltage being developed across the grid-leak resistor 202 in parallel with condenser 201. The signal intelligence voltage developed across this grid-leak resistor is not amplified by tube 104 in the usual sense but is filtered by resistor 21 and condenser 22 and coupled to audio amplifier 7. The push-push frequency doubler amplifier functions as previously described providing an amplifier output voltage at a frequency of $2f_1$ with respect to the I. F. amplifier output voltage at the frequency $f_1$. AGC rectifier 112 coupled to the output circuit of the frequency doubler amplifier supplies a unidirectional gain control voltage to the I. F. amplifiers and the audio amplifier as previously described.

Figure 5:
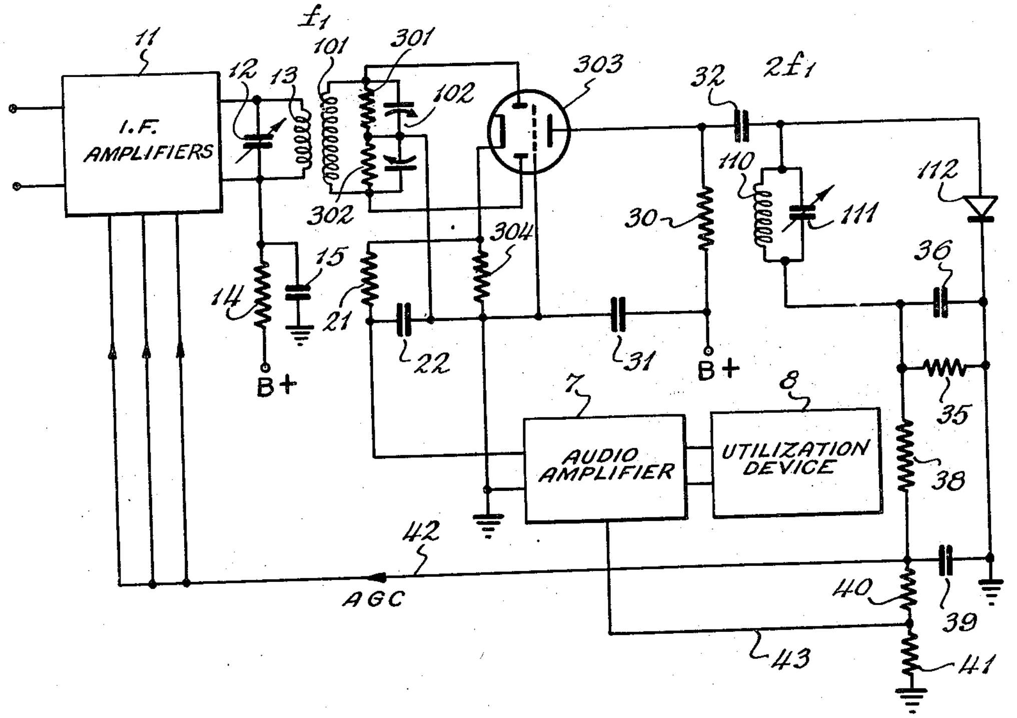
Figure 5 is a schematic diagram illustrating another embodiment of the invention.

An arrangement in which the amplification of the AGC voltage is obtained after frequency doubling is illustrated by the schematic diagram in Fig. 5. A duo-diode-triode tube 303 is employed as a combination full-wave diode rectifier or detector and grounded-grid band-pass amplifier. The two plates of the diode section of the tube are coupled to the resonant circuit of secondary inductor 101 and condenser 102. The rotor of the split-stator condenser 102 is grounded. The control-electrode of the tube is also coupled to ground. The cathode is returned to ground through resistor 304 and is unbypassed. The value of resistor 304 is such as to bias the control-electrode almost to cut-off.

Full-wave rectified I. F. voltage appears across cathode resistor 304. This rectified voltage is filtered by resistor 21 and condenser 22 to remove the intermediate frequency voltages and the audio signal intelligence voltage is applied to audio amplifier 7. The rectified I. F. voltage across resistor 304 drives the cathode of the grounded-grid amplifier at twice the intermediate frequency as two pulses of cathode current flow for each cycle of the I. F. output voltage. The resonant circuit of inductor 110 and condenser 111 is tuned to twice the intermediate frequency. The cathode driven, grounded-grid amplifier provides the desired amount of voltage gain at the frequency $2f_1$. The AGC rectifier 112 coupled to the output circuit of the ground-grid amplifier supplies a unidirectional voltage to the gain controlling electrodes of the I. F. amplifiers 11 and the audio amplifier 7 as previously described.

While the invention has been described in general terms, it is not specifically limited to the present disclosure. The invention is readily adaptable to other modifications and may be arranged in combination with known circuits to form more useful apparatus.

What is claimed is:

1. The combination of a band pass amplifier designed to provide substantially linear amplification of an amplitude modulated carrier signal of a selected frequency and to attenuate signals of all other frequencies, utilization means including an amplitude modulation detector, and means for directly applying said amplified signal with its modulation, without the introduction of amplitude distortion, to said amplitude modulation detector; means responsive to the output of said amplifier to produce and select a signal which is a single harmonic of said carrier frequency signal, and means responsive to the amplitude of said selected harmonic signal only to control the gain of said band pass amplifier.

2. A combined amplitude modulation detector and automatic gain control circuit, including a pair of electron discharge tubes each including at least a cathode, a control grid, and an anode, means connecting said cathodes to each other and means connecting said anodes together to place the space discharge paths of said tubes in parallel, means including a center-tapped resonant circuit for applying a modulated carrier signal to said control grids in phase opposition, a load resistor connected between the center tap of said resonant circuit and said cathodes, and modulation frequency utilization means connected across said load resistor; a gain control rectifier, and means including a band pass filter, designed to pass a harmonic of said carrier signal and to attenuate all other signals, coupling said anodes to said rectifier.

3. The combination of a band pass amplifier including a gain control terminal and designed to amplify an amplitude modulated carrier signal and to attenuate signals of other frequencies, a pair of electron discharge devices having respective cathode means connected to a common cathode terminal, respective anode means connected to a common anode terminal, and separate signal input electrodes, means including a center-tapped resonant circuit for applying said amplified modulated carrier signal to said signal input electrodes in phase opposition, a load resistor connected between the center tap of said resonant circuit and said common cathode terminal, and modulation frequency utilization means connected across said load resistor; a gain control rectifier having input and output terminals, means including a band pass filter, designed to pass substantially only a harmonic of said carrier signal, coupling said first mentioned common anode terminal to the input of said rectifier, and means coupling the output of said rectifier to said gain control terminal.

4. A combined amplitude modulation detector and gain control circuit, including a pair of diodes having separate anodes and respective cathode means connected to a common cathode terminal, and an amplifier tube having a cathode connected to said common cathode terminal, said amplifier tube having a separate anode and at least one control grid, means including a center-tapped resonant circuit for applying a modulated carrier signal to said diode anodes in phase opposition, a load resistor connected between the center tap of said resonant circuit and said common cathode terminal, and modulation frequency utilization means connected across said load resistor; means connecting said control grid directly to said center tap, a control rectifier having input terminals and output terminals, means including a band pass filter, designed to pass substantially only a harmonic of said carrier signal, coupling said amplifier tube anode to said rectifier input terminals, and gain control signal utilization means connected to the output terminals of said rectifier.

BENJAMIN F. SPENCER.

REFERENCES CITED

The following references are of record in the file of this patent:

UNITED STATES PATENTS

| Number | Name | Date |
|---|---|---|
| 1,420,055 | Nichols | June 20, 1922 |
| 1,660,930 | MacDonald | Feb. 28, 1928 |
| 1,711,636 | Eaves | May 7, 1929 |
| 2,013,121 | Wheeler | Sept. 3, 1935 |
| 2,068,769 | Schlesinger | Jan. 26, 1937 |
| 2,183,206 | Stone | Dec. 12, 1939 |
| 2,243,141 | Weagant | May 27, 1941 |
| 2,253,450 | Travis | Aug. 19, 1941 |
| 2,397,830 | Bailey | Apr. 2, 1946 |
| 2,420,248 | Koch | May 6, 1947 |
| 2,527,617 | Berger | Oct. 31, 1950 |

FOREIGN PATENTS

| Number | Country | Date |
|---|---|---|
| 471,812 | Great Britain | Sept. 10, 1937 |